(12) United States Patent
Yamada

(10) Patent No.: US 6,360,048 B1
(45) Date of Patent: Mar. 19, 2002

(54) WAVEGUIDE OPTICAL SEMICONDUCTOR DEVICE, METHOD OF FABRICATING THE SAME AND OPTICAL DEVICE MODULE

(75) Inventor: Koji Yamada, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/434,485

(22) Filed: Nov. 5, 1999

(30) Foreign Application Priority Data

Jan. 19, 1999 (JP) .......................................... 11-010527

(51) Int. Cl.[7] .................................................. G02B 6/10
(52) U.S. Cl. .............................. 385/131; 385/2; 385/8; 385/14; 385/75; 385/130; 372/50
(58) Field of Search ....................... 257/432; 372/43–46, 372/50; 385/2, 8, 14, 40, 75, 129–131

(56) References Cited

U.S. PATENT DOCUMENTS

| | | | |
|---|---|---|---|
| 5,396,363 A | * 3/1995 | Valette ........................ | 359/248 |
| 5,825,047 A | * 10/1998 | Ajisawa et al. ............... | 257/12 |
| 6,185,033 B1 | * 2/2001 | Bosc et al. .................. | 359/254 |
| 6,246,709 B1 | * 6/2001 | Oshiba et al. ................ | 372/50 |

FOREIGN PATENT DOCUMENTS

| JP | 02-209782 | 8/1990 |
|---|---|---|
| JP | 04-329688 | 11/1992 |

OTHER PUBLICATIONS

"High Reliability 1.3μm Ridge Waveguide MQW Lasers", N. Matsumoto et al.; Proceedings of the 1998 Conference of the Institute of Electronics, Information and Engineers p4–195; Japan; 1 page.

"Small–sized 2.4 Gb/s Optical Receiver Module with Surface Mounting Waveguide PIN–PD"; M. Tachigori et al.; Proceedings of the 1997 Conference of the Institute of Electronics, Information and Engineers p347; Japan; 1 page.

\* cited by examiner

*Primary Examiner*—Brian Healy
*Assistant Examiner*—Omar Rojas, Jr.
(74) *Attorney, Agent, or Firm*—Rabin & Berdo P.C.

(57) ABSTRACT

A waveguide optical semiconductor device, a method of fabricating the same and an optical device module. The semiconductor device includes a substrate, a waveguide formed on the substrate, an electrode layer formed on the waveguide, and bumpers formed on the substrate. The bumpers are disposed on both side of the waveguide, and top surfaces of the bumpers are higher than a top surface of the electrode layer. The method of fabrication includes forming semiconductor layers for waveguide on a substrate, forming another semiconductor layer on the semiconductor layers, removing the another semiconductor layer and at least a part of the semiconductor layers selectively so that grooves are formed on both side of a region where the waveguide are expected to be formed, removing the another semiconductor layer at the region, remained portions of the another semiconductor layer form bumpers. The module includes a waveguide optical semiconductor device having bumpers disposed on both side of the waveguide, and a carrier having a mounting region in contact with the top surfaces of the bumpers.

19 Claims, 9 Drawing Sheets

US 6,360,048 B1

WAVEGUIDE OPTICAL SEMICONDUCTOR DEVICE, METHOD OF FABRICATING THE SAME AND OPTICAL DEVICE MODULE

FIELD OF THE INVENTION

The invention relates to a waveguide optical semiconductor device, a method of fabricating the same and an optical device module.

BACKGROUND OF THE INVENTION

A conventional waveguide optical semiconductor device is described, for example, in Proceedings of the 1993 Conference of the Institute of Electronics, Information and Engineers, p. 4–195. A waveguide optical semiconductor device described in this publication includes a waveguide portion and an upper electrode disposed on the waveguide portion.

In a conventional waveguide optical device, the waveguide portion sticks out of the surface of the device. Therefore, in manufacturing or inspecting the device, external force tends to be applied to the waveguide portion. As a result, cracks or defects are generated in the upper electrode or the waveguide portion.

A conventional optical device module is described, for example, in Proceedings of the 1997 Conference of the Institute of Electronics, Information and Engineers, p. 347. An optical device module described in this publication includes a waveguide optical semiconductor device and a carrier on which the optical device is mounted.

In a conventional optical device module, the carrier has terrace-shaped $SiO_2$ films on its surface for receiving the optical device. The $SiO_2$ films are swellings in the device mounting region of the carrier. Therefore, levelness of the device mounting region is reduced.

SUMMARY OF THE INVENTION

It is therefore an object of the invention to provide a waveguide optical semiconductor device, a method of fabricating the same and an optical device module, which solve the above-described problem. According to the present invention, such a device includes a substrate, a waveguide formed on the substrate, an electrode layer formed on the waveguide, and bumpers formed on the substrate, the bumpers are disposed on both side of the waveguide, and top surfaces of the bumpers are higher than a top surface of the electrode layer.

Therefore, the electrode layer formed on the waveguide does not stick out of the top surface of the bumpers. As a result, it is avoided that external force is applied to the waveguide.

BRIEF DESCRIPTION OF THE DRAWING

The objects and features of the invention will become more apparent from the consideration of the following detailed description taken in conjunction with the accompanying drawings in which.

DESCRIPTION OF THE PREFERRED EMBODIMENT

The First Embodiment

Figure 1:
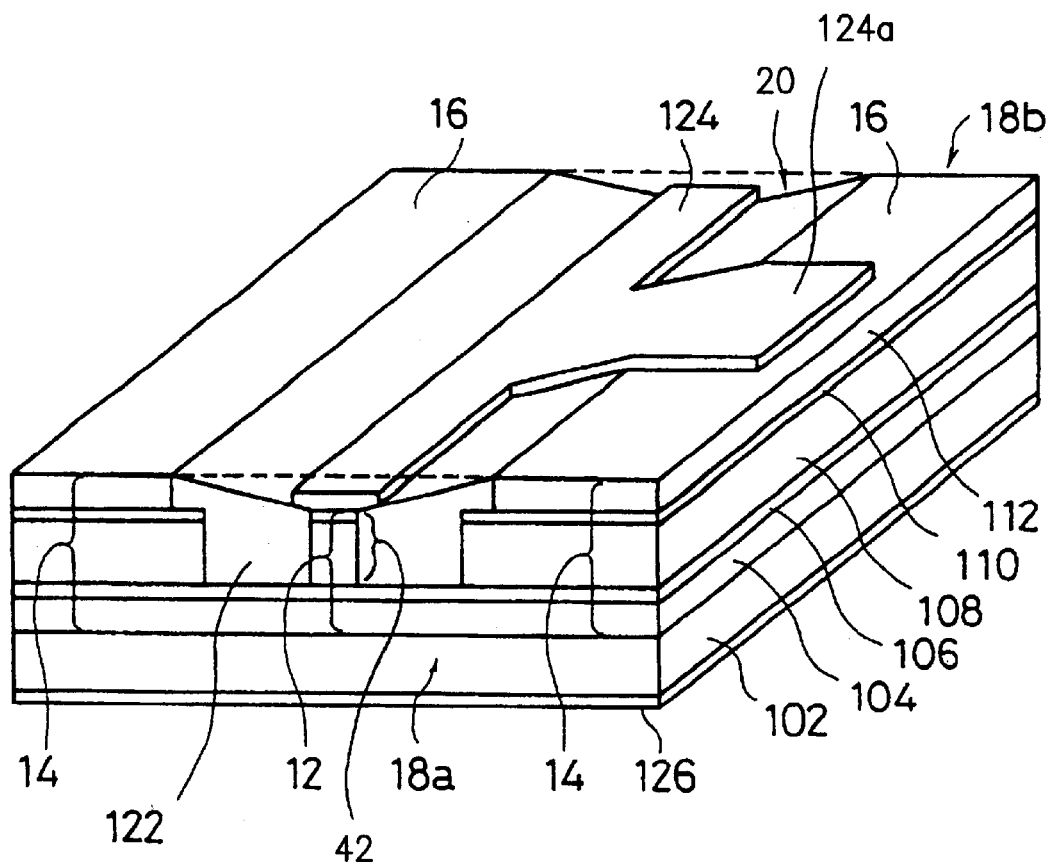
FIG. 1 is an oblique view of a first embodiment according to the invention.

FIG. 1 illustrates the first embodiment of the invention, an optical semiconductor device 10. In FIG. 1, a lower clad layer 104 and an optical guide layer 106 are formed in stated order on a semiconductor 102. A mesa stripe 42 including an upper clad layer 108 and a contact layer 110, is formed on the optical guide layer 106. Along with the optical guide layer 106 and the lower clad layer 104, the mesa stripe 42 forms a waveguide 12.

An both side of the mesa stripe 42, bumpers 14 are formed on the optical guide layer 106 to be higher than the mesa stripe 42. Each of the bumpers 14 includes an upper clad layer 108, a contact layer 110 and a cap layer 112. Between the mesa stripe 42 and bumpers 14, insulating layers 122 are formed.

An upper electrode 124 is formed on the contact layer 110 of the mesa stripe 42 and a lower electrode 126 is formed on a bottom surface of the semiconductor substrate 102. A part of the upper electrode 124 extends on one of the bumpers 14 in order to form a bonding pad 124a.

The difference of the height between the mesa stripe 42 and the bumpers, 14 generates a hollow 20 above the mesa stripe 42. The hollow 2Q has enough depth so that an upper electrode 124 above the mesa stripe 42 does not stick out of the hollow 20. Therefore, objects contact the top surfaces 16 of the bumpers 14, but not the upper electrode 124 in the hollow 20. Thus, it is avoided that the external force applied to the waveguide 12.

When a specified electric signal is applied along with a specified voltage between the upper electrode 124 and the lower electrode 126, an effect of confining optical wave and a specified optical function are obtained in the optical guide layer 106 of the optical waveguide 12. Therefore, a light which propagates in the optical waveguide 12 radiates from a first facet 18a or a second facet 18b of the optical semiconductor device 10.

FIGS. 2 to 8 illustrate a process of a method of fabricating the waveguide optical semiconductor device 10.

Figure 2:
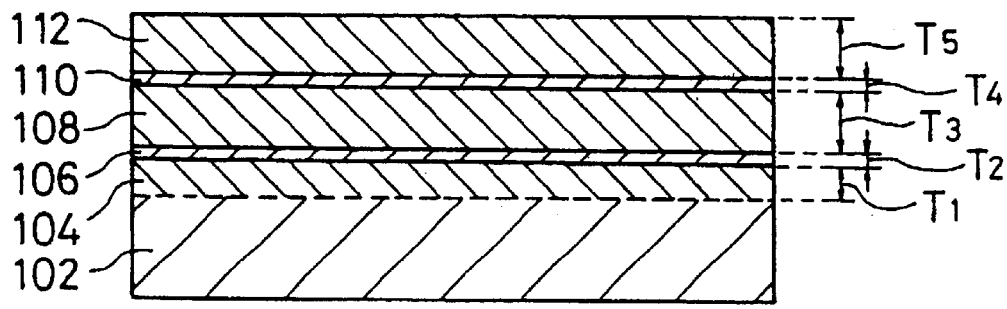
FIGS. 2 to 8 are schematic views of fabricating process of the first embodiment.

In FIG. 2, a lower clad layer 104 of a first conductivity type, an optical guide layer 106, an upper clad layer 108 of a second conductivity type, a contact layer 110 of the second conductivity type and a cap layer 112, are formed in the stated order on a semiconductor substrate 102 of the first, conductivity type. These layers 104–112 are formed by, for example, a conventional epitaxial growth method.

For example, an n-InP crystal is grown on the substrate 102 to form the lower clad layer 104 of a thickness $T_1$ (1 $\mu$m). An undoped InGaAs crystal is grown on the lower clad layer 104 to form the optical guide layer 106 of a thickness $T_2$ (0.2 $\mu$m). A p-InP crystal is grown on the optical guide layer 106 to form the upper clad layer 108 of a thickness $T_3$ (1 $\mu$m).

Then a $p^+$-InGaAs crystal is grown on the upper clad layer 108 to form the contact layer 110 of a thickness $T_4$ (0.2 $\mu$m).

A p-InP crystal is grown on the contact layer 110 to form the cap layer 112 of a thickness $T_5$ (1 μm).

Figure 3:
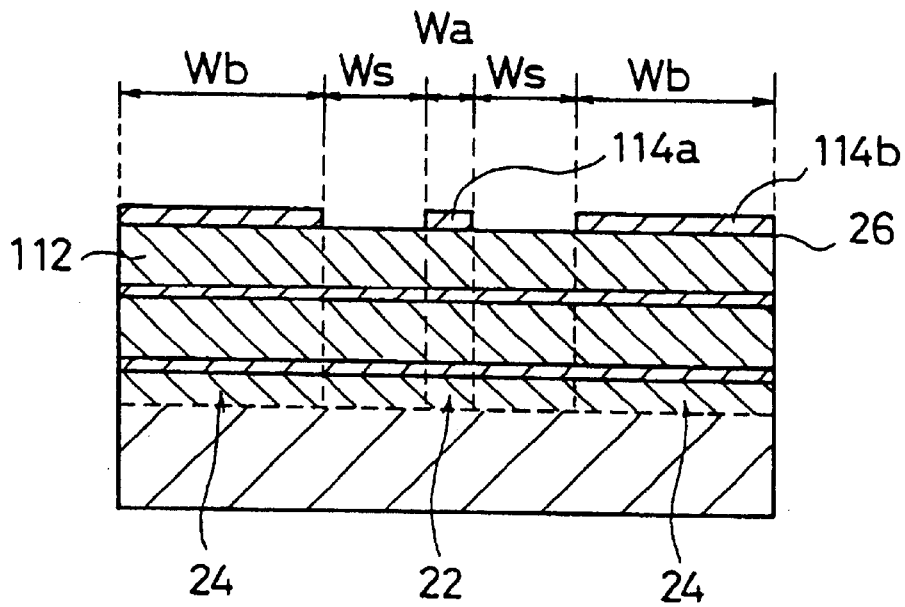

Then, as shown in FIG. 3, a first mask 114a and second masks 114b X are formed on the cap layer 112. The first mask 114a is strip-shaped and is located to be above a waveguide portion 22. On both side of the first mask, the second masks 114b are located to be above bumper portions 24.

The first mask 114a and the second masks 114b are formed by patterning dielectric film, e.g. $SiO_2$ film, using conventional photolithography. The width Wa of the first mask 114a is 3 μm and the distance Ws between the first mask 114a and each of the second masks 114b is 10 μm.

Figure 4:
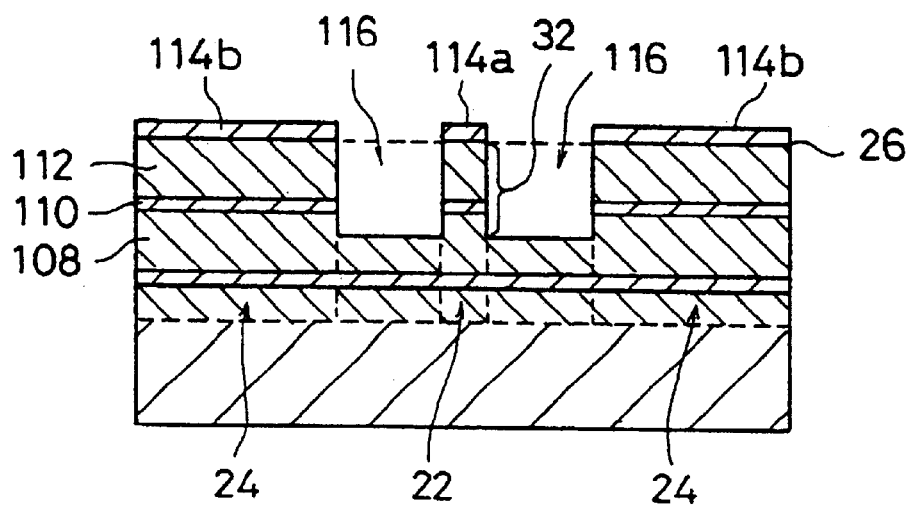

Then, as shown in FIG. 4, the cap layer 112 and the contact layer 110 are removed selectively by anisotropic dry etching employing the first mask 114a and the second masks 114b as etching masks. The etching is kept until the grooves 116 reach the upper clad layer 108 so as to pierce the contact layer 110. For the dry etching, for example, plasma etching using combination gas of chlorine (Cl) and argon (Ar) is applied.

Figure 5:
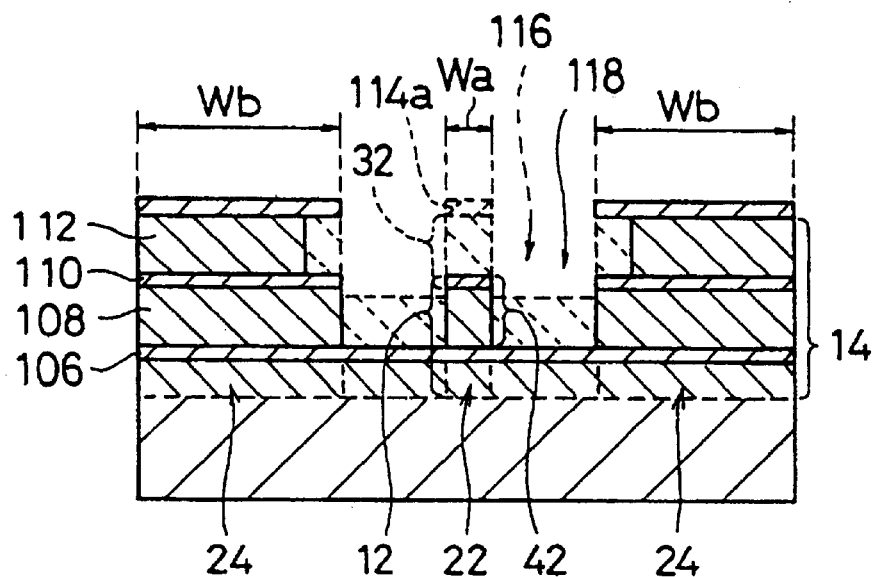

Then, as shown in FIG. 5, the cap layer 112 is removed selectively, under the mask 114a and masks 114b by wet etching. A portion of the cap layer 12 under the mask 114a is etched thoroughly, and therefore, the mask 114a is lifted off.

The upper clad layer 108 is also removed selectively by this wet etching. However, the contact layer 110 and portions of the upper clad layer 108 under the contact layer 110 are not etched. Therefore, a mesa stripe 42 including the upper clad layer 108 and the contact layer 110 is formed. Simultaneously, the bumpers 14 including the layers 108–112 are formed on both side of the mesa stripe 42.

The mesa stripe 42, and portions of the optical guide layer 106 and the lower clad layer 104 under the mesa stripe 42, form an optical waveguide 12.

As etchani for the above wet etching, solution of hydrochloric acid (HClaq) or combination solution of hydride bromide (HBr) and acetic acid ($CH_3COOH$) is used so as to etch only InP.

Figure 9:
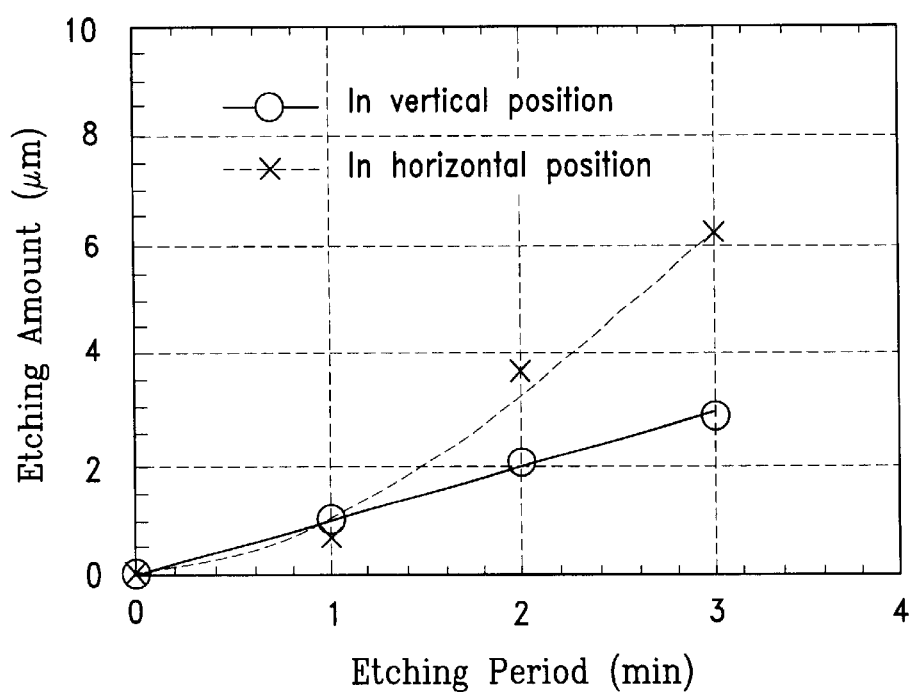
FIG. 9 is a graph showing etching rate of InP.

FIG. 9 shows etching rate of InP with the combination solution of hydride bromide and acetic acid. In FIG. 9, etching amount in the horizontal direction, that is amount of side etching, reaches 1.5 μm in about 1 minute and 15 seconds. Therefore, for example, when width of the cap layer 112 on the mesa stripe 42 is 3 μm, the cap layer 112 is removed through the etching in about 1 minute and 15 seconds.

Figure 6:
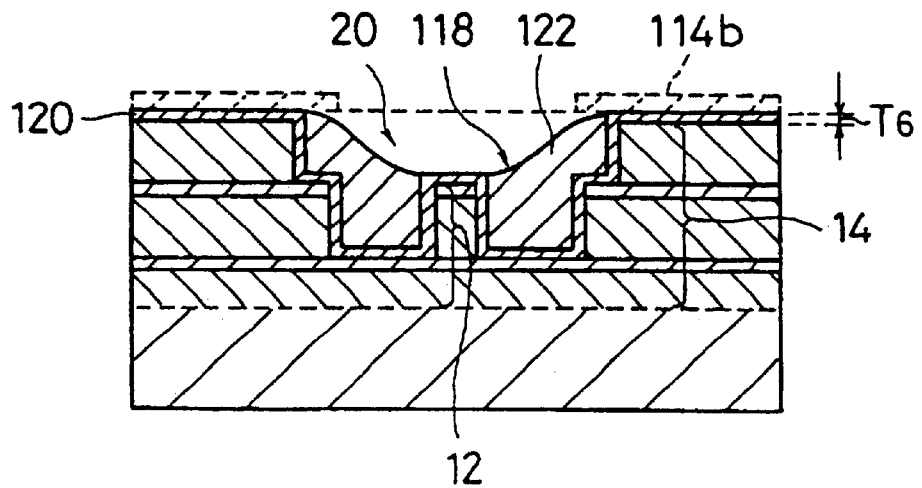

Then, as shown in FIG. 6, after the masks 114b are removed, a passivation film 120 of insulating material is coated on whole exposed surface. The thickness $T_6$ of the passivation film 120 is 0.2 μm. Then both sides of the mesa stripe 42 are filled with the insulating layers 122 of insulating material such as a polyimide. As a result, the hollow 20 is formed above the optical waveguide 12.

Figure 7:
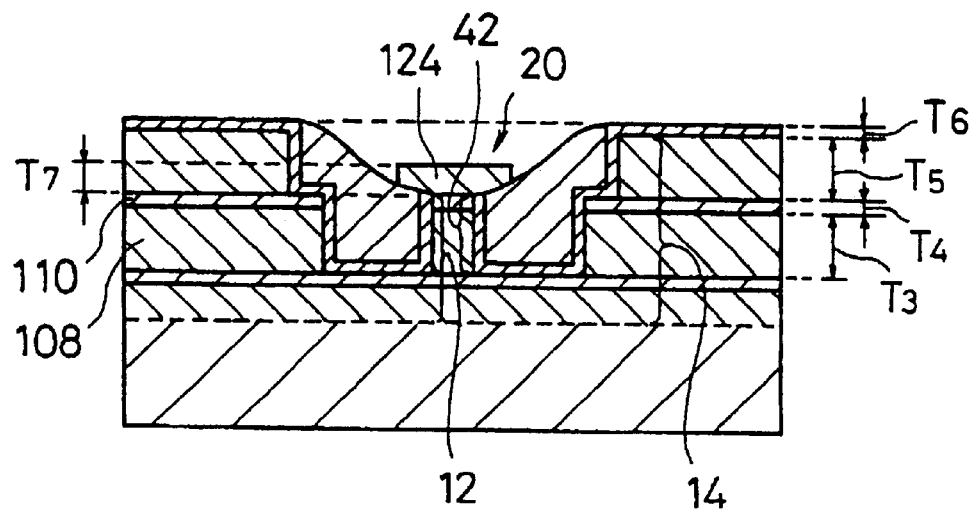

Then, as shown in FIG. 7, after the passivation film 120 above the mesa stripe 42, that is at the bottom of the hollow 20, is removed, the upper electrode 124 is formed on the contact layer 110 of the optical waveguide 12. The thickness $T_7$ of the upper electrode 124 is selected not to stick out of the hollow 20. In this embodiment, the thickness $T_7$ is, for example, 0.5 μm.

Figure 8:
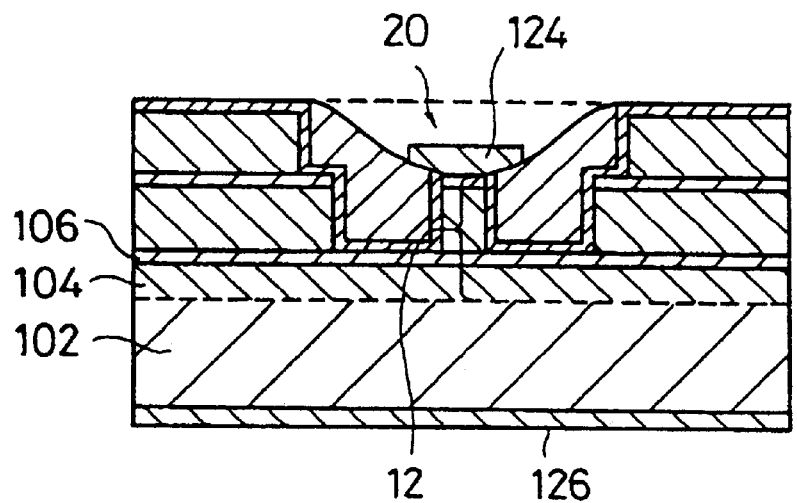

Then, as shown in FIG. 8, after the substrate 102 is ground so as to obtain specified thickness, the lower electrode 126 is formed on the bottom surface of the substrate 102.

As described above, according to the invention, the optical device 10 has the bumpers 14. Therefore, upper electrode 124 does not stick out of the hollow 20. It is avoided that the external force is applied to the optical waveguide 12.

Figure 10:
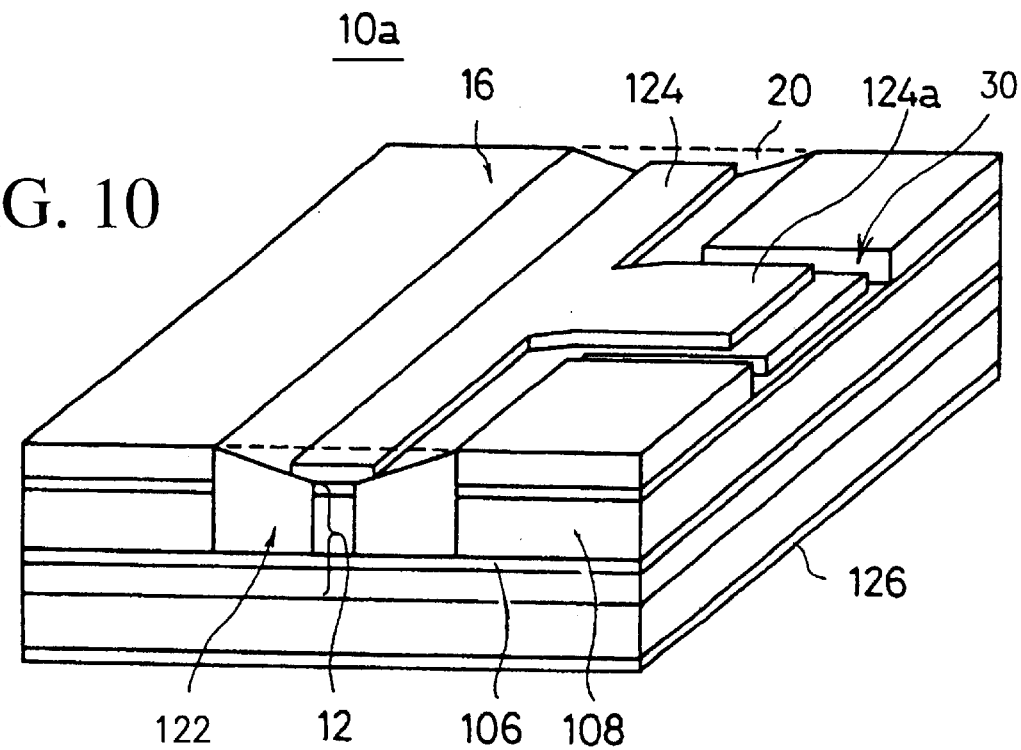
FIG. 10 is an oblique view of a first modification of the first embodiment.

FIG. 10 shows a first modification of the first embodiment. As shown in FIG. 10, a part of the cap layer 112 of the bumper 14 is removed so as to make a recess 30, and the insulating layer 122 and the upper electrode 124 extend on the recess 30. Therefore, the upper electrode 124 is formed in shape of T figure. In this modification, a bonding pad 124a, a portion of the upper electrode 124 on the bumper 14, does not stick out of the top surface 16 of the bumper 14.

Figure 11:
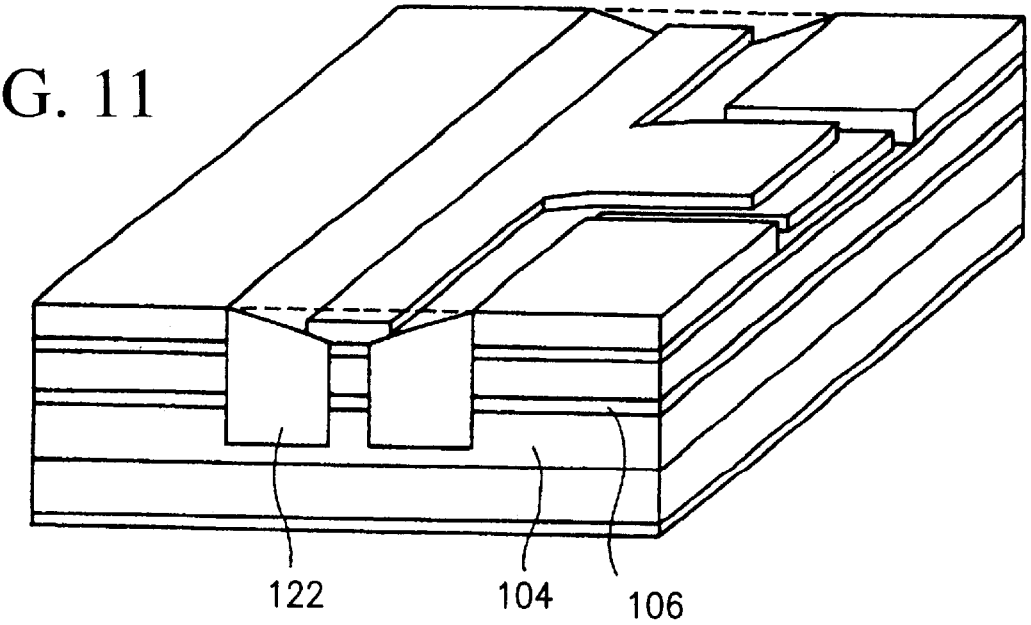
FIG. 11 is an oblique view of a second modification of the first embodiment.

FIG. 11 shows a second modification of the first embodiment. In FIG. 11, the grooves 118 pierce the optical guide layer 106 and reach the lower clad layer 104. In this modification, the optical guide layer 106 of the waveguide 12 is sandwiched between the insulating layers 122. Therefore, it is improved to confine light-wave in the optical guide layer 106. This modification has advantage when it is applied to an optical semiconductor device which has a bent waveguide.

Figure 12:
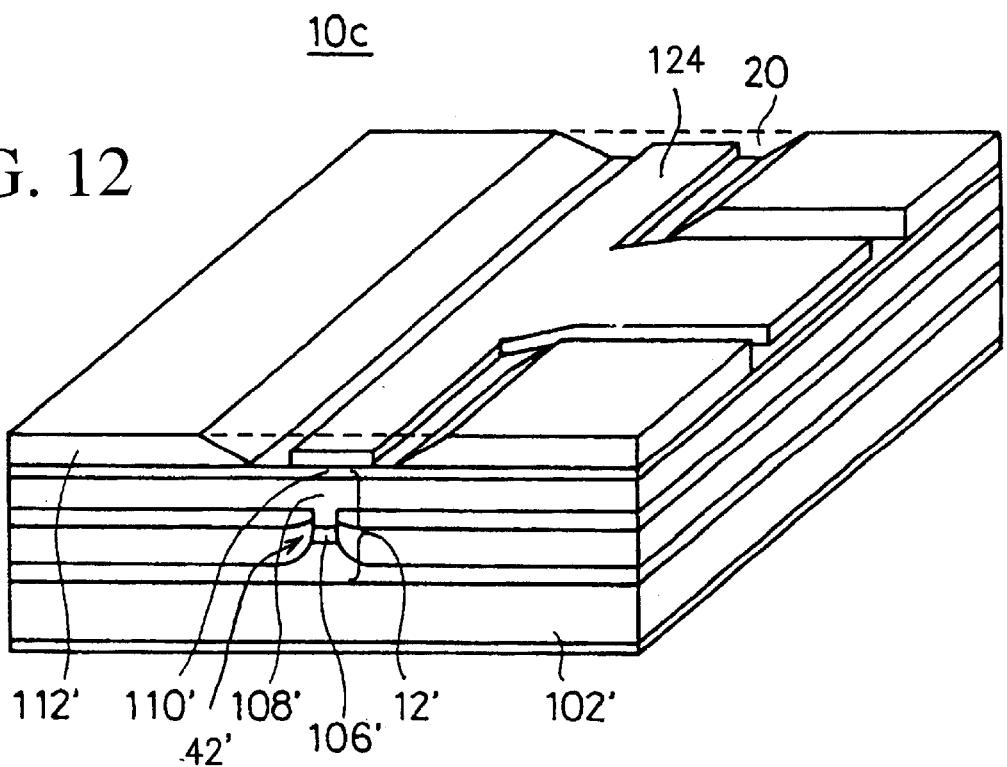
FIG. 12 is an oblique view of a third modification of the first embodiment.

FIG. 12 shows a third modification of the first embodiment. In FIG. 12, the optical device 10c is of buried waveguide-type and the both sides of the mesa stripe 42' are buried in semiconductor layers. A portion of the cap layer 112' above the optical waveguide 12 is removed so that the hollow 20 is formed above the waveguide 12'. In the hollow 20, the upper electrode 124 is formed on the contact layer 110' to be above the waveguide 12'.

A part of the cap layer 112' of the bumper 14' is removed and the upper electrode 124 extends there. The upper electrode 124 is thinner than the-cap layer 112'. Therefore, a bonding pad 124a, a portion of the upper electrode 124 does not stick out of the surface 16 of the device 10c.

Figure 13:
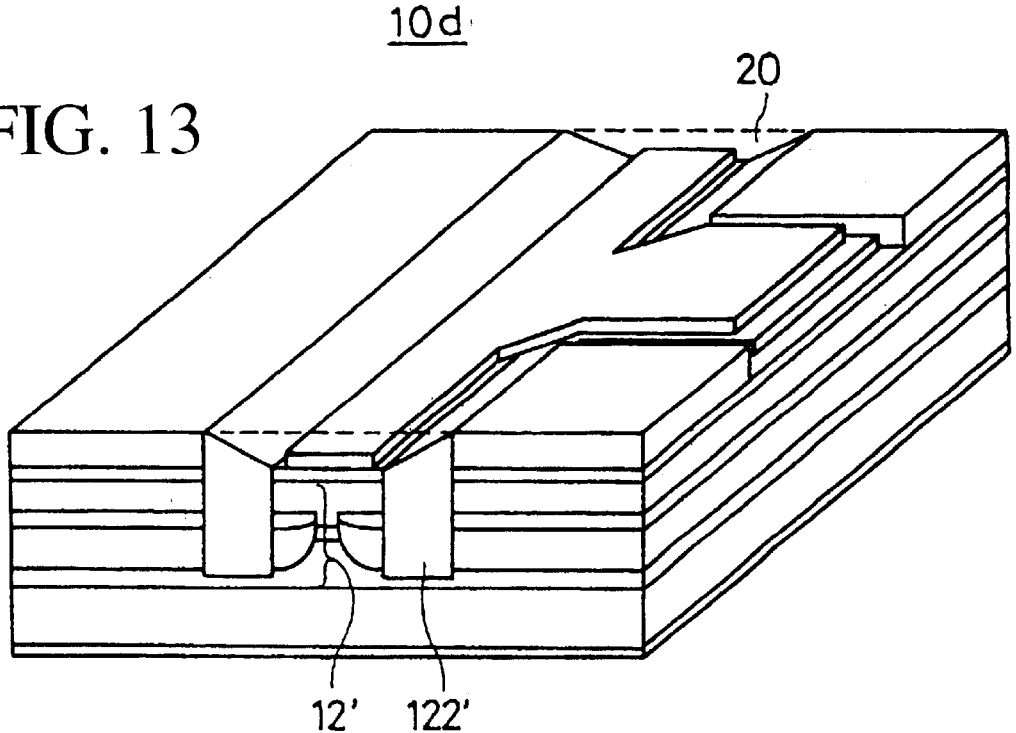
FIG. 13 is an oblique view of a fourth modification of the first embodiment.

FIG. 13 shows a fourth modification of the first embodiment. In FIG. 13, the optical device 10d is of another buried waveguide-type. Grooves 118' are formed on both sides of the waveguide 12', and are filled with insulating layers 122'.

The Second Embodiment

Figure 14:
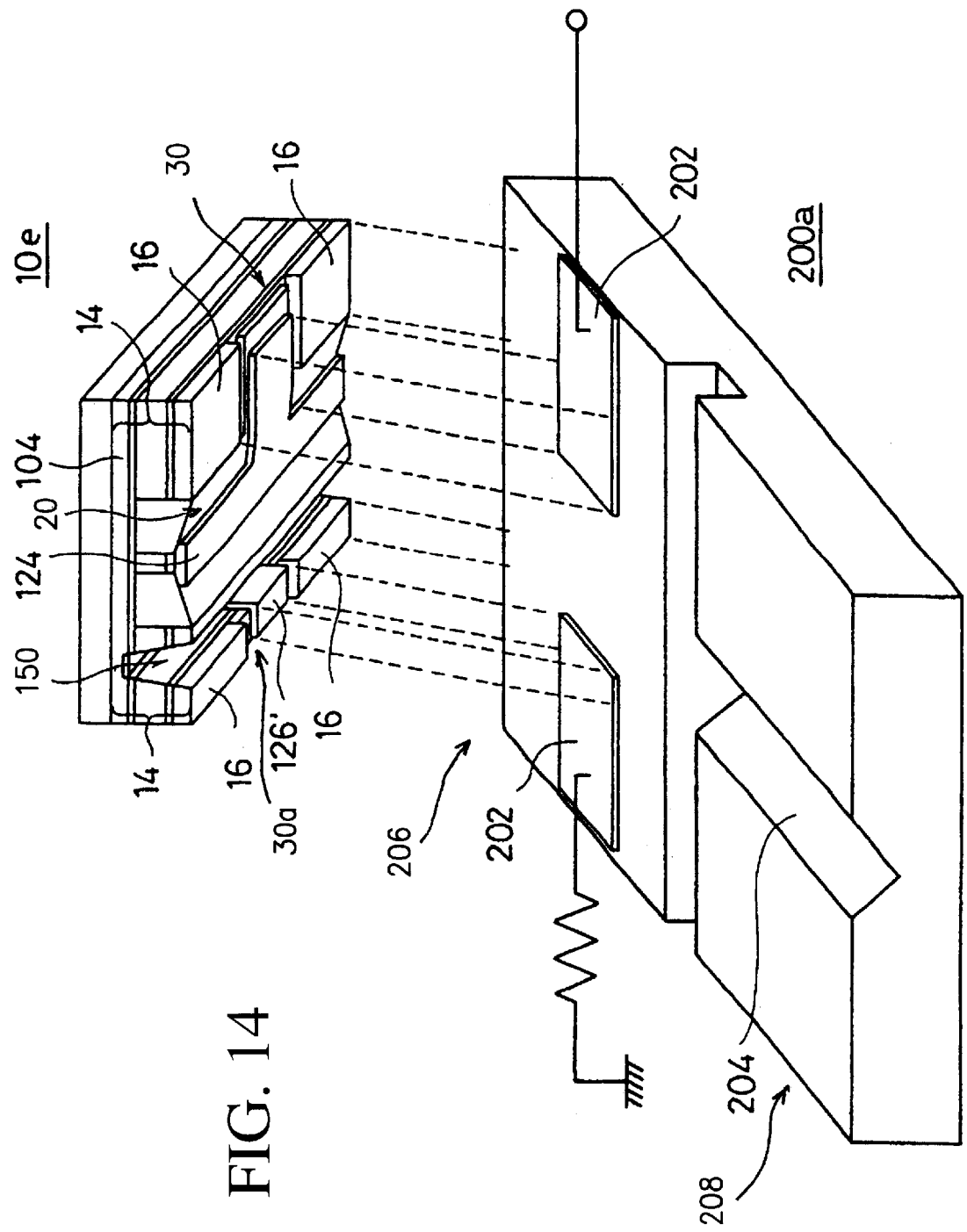
FIG. 14 is an oblique view of a second embodiment according to the invention.

Referring to FIG. 14, in a second embodiment, an optical device module includes a waveguide optical semiconductor device 10e and a carrier 200a.

In FIG. 14, the device 10e employs a second upper electrode 126' instead of the lower electrode 126 of the first embodiment. The upper electrode 124 extends on the recess 30 of the one bumper 14. The other bumper 14 has a groove 150 which reaches the lower clad layer 104. A region of the other bumper 14 which is apart from the hollow 20 has a recess 30a. The second upper electrode 126' is formed continuously from the recess 30a to the bottom of the groove 150.

The carrier 200a includes a device mounting region 206 and a fiber mounting region 208. Electrodes 202 are formed on the device mounting region 206. The electrodes 202 are, for example, microstrip lines or coplanar lines. A V-groove 204 is formed in the fiber mounting region 208 to hold a optical fiber.

The device 10e is mounted so that the upper electrodes 124 and 126' contact the electrodes 202 of the carrier 200a, and the top surfaces 16 of the bumpers 14 contact the surface of the device mounting region 206. Surfaces of the upper electrodes 124 and 126' at the recesses 30 and 30a are lower than the top surfaces 16 of the bumpers 14. For example, the gap of the surfaces is 0.5 μm, and the thickness of the electrodes 202 of the carrier 200a is 0.5 μm. To strengthen the contact between the electrodes 124, 126' and the electrodes 202, solder may be used.

For coupling the bumper 14 and device mounting region 206, metal films (not illustrated) may be formed respectively on the top surfaces 16 of the bumpers 14 and the corresponding areas of the device mounting region 206. Then corresponding metal films of the bumpers 14 and the device mounting region 206 are coupled with the solder.

When amount of the solder is too much, the hollow -20 receives the extra solder so that a short circuit between the upper electrode 124 and the second upper electrode 126' is avoided.

Figure 15:
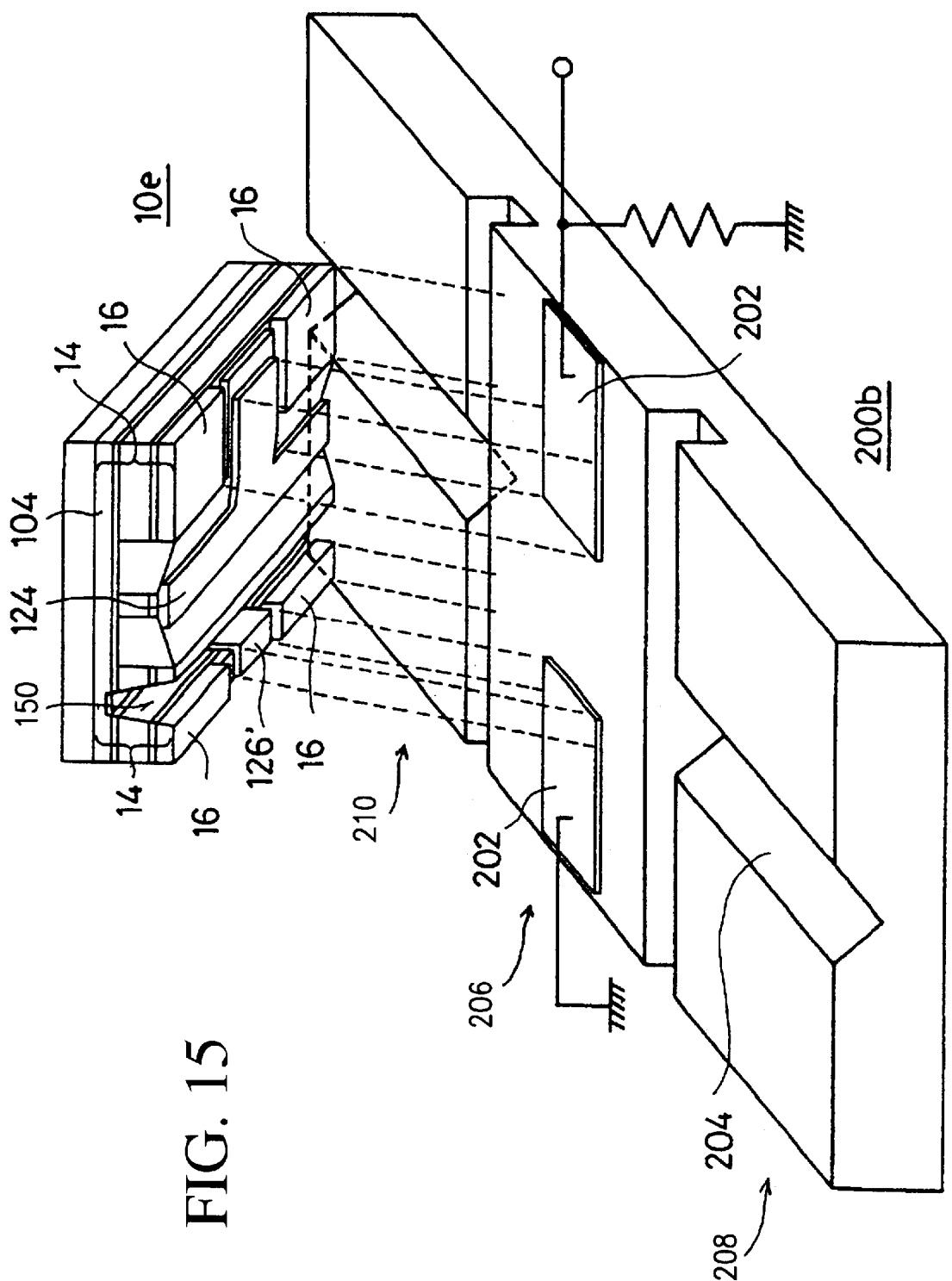
FIG. 15 is an oblique view of a modification of the second embodiment.

FIG. 15 shows a modification of the second embodiment. In FIG. 15, carrier 200b has two fiber mounting regions 208 and 210 on both sides of the device mounting region 206.

In the second embodiment, the device 10e is mounted stably by putting the surfaces 16 of the bumpers 14 to the surface of the carrier 200a (200b). Therefore, it is not required to make other parts on the carrier 200a (200b) to receive the device 10e.

Moreover, morphology and levelness of the surfaces 16 of the bumpers 14 are accurate because of the crystal growth. That is advantage for aligning the device 10e to the optical fibers mounted on the carrier 200a (200b).

While the invention has been described with reference to two embodiments thereof, it will be understood by those skilled in the art that modifications thereof can be made without departing from the spirit and scope of the invention, and the invention includes all such modifications and variations, the scope of the invention to be limited only by the appended claims.

For example, the type of the waveguide in the embodiment is not limited as a ridge-type. A BH-type, a rib-type or a planer-type can be employed. Moreover, the invention is applicable to various type of optical semiconductor device such as an optical modulator, a laser diode, an optical amplifier, a wavelength transformer, an optical filter, a photo diode, a photo coupler, LED or monolithically integrated device thereof.

What is claimed is:

1. A waveguide optical semiconductor device, comprising:
    a substrate;
    a waveguide formed on the substrate, the waveguide having a top surface with a first height;
    a pair of bumpers formed on the substrate, the bumpers being disposed one on each side of the waveguide, each of the bumpers having a top surface with a second height that is higher than the first height; and
    an electrode layer formed on the top surface of the waveguide and the top surface of one of the bumpers so that the electrode layer extends from the waveguide to the one of the bumpers.

2. A semiconductor device according to claim 1, wherein the one of the bumpers has a recess and the electrode layer extends into the recess.

3. A semiconductor device according to claim 1, wherein the waveguide is a ridge stripe type waveguide.

4. An optical device module, comprising:
    a waveguide optical semiconductor device having
        a substrate,
        a waveguide formed on the substrate, the waveguide having a top surface with a first height,
        a pair of bumpers formed on the substrate, the bumpers being disposed one on each side of the waveguide, each of the bumpers having a top surface with a second height that is higher than the first height, and
        an electrode layer formed on the top surface of the waveguide and the top surface of one of the bumpers so that the electrode layer extends from the waveguide to the one of the bumpers; and
    a carrier having a mounting region for the waveguide optical semiconductor device, the mounting region being in contact with the top surface of both bumpers.

5. An optical device module according to claim 4, further comprising:
    metal films formed on the top surfaces of the bumpers and the corresponding areas of the mounting region; and
    solder coupling corresponding metal films of the bumpers and the mounting region.

6. A semiconductor device according to claim 1, wherein the waveguide is of a buried waveguide type.

7. A semiconductor device according to claim 1, wherein another electrode is formed on the other bumper.

8. A semiconductor device according to claim 1, wherein the substrate, the waveguide and the bumpers are formed of semiconductor materials.

9. An optical device module according to claim 4, wherein the one of the bumpers has a recess and the electrode layer extends into the recess.

10. An optical device module according to claim 4, wherein the waveguide is a ridge stripe type waveguide.

11. An optical device module according to claim 4, wherein the waveguide is of a buried waveguide type.

12. An optical device module according to claim 4, wherein another electrode is formed on the other bumper.

13. An optical device module according to claim 4, wherein the substrate, the waveguide and the bumpers are formed of semiconductor materials.

14. A waveguide optical semiconductor device, comprising:
    a semiconductor substrate;
    a waveguide having a first thickness formed on the substrate;
    a pair of bumpers formed on the substrate, the bumpers being disposed one on each side of the waveguide, each of the bumpers having a second thickness that is thicker than the first thickness; and
    an electrode layer formed on the waveguide and one of the bumpers so that the electrode layer extends from the waveguide to the one of the bumpers.

15. A waveguide optical semiconductor device according to claim 14, wherein the electrode layer has a third thickness that is thinner than the first thickness.

16. A waveguide optical semiconductor device according to claim 14, wherein the second thickness is thicker the total of the first and third thicknesses.

17. A waveguide optical semiconductor device according to claim 14, wherein the one of the bumpers has a recess and the electrode layer extends into the recess.

18. A waveguide optical semiconductor device according to claim 14, wherein another electrode is formed on the other bumper.

19. A waveguide optical semiconductor device according to claim 14, wherein the substrate, the waveguide and the bumpers are formed of semiconductor materials.

* * * * *